(12) United States Patent
Wang et al.

(10) Patent No.: US 10,833,067 B1
(45) Date of Patent: Nov. 10, 2020

(54) METAL RESISTOR STRUCTURE IN AT LEAST ONE CAVITY IN DIELECTRIC OVER TS CONTACT AND GATE STRUCTURE

(71) Applicant: GLOBALFOUNDRIES INC., Grand Cayman (KY)

(72) Inventors: Haiting Wang, Clifton Park, NY (US); Sipeng Gu, Clifton Park, NY (US); Jiehui Shu, Clifton Park, NY (US); Scott H. Beasor, Greenwich, NY (US); Zhenyu Hu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/519,135

(22) Filed: Jul. 23, 2019

(51) Int. Cl.
*H01L 27/06* (2006.01)
*H01L 49/02* (2006.01)
*H01L 29/66* (2006.01)
*H01L 29/51* (2006.01)
*H01L 29/78* (2006.01)
*H01L 29/06* (2006.01)

(52) U.S. Cl.
CPC .......... *H01L 27/0629* (2013.01); *H01L 28/24* (2013.01); *H01L 29/515* (2013.01); *H01L 29/665* (2013.01); *H01L 29/78* (2013.01); *H01L 29/0653* (2013.01)

(58) Field of Classification Search
CPC ... H01L 27/0629; H01L 29/515; H01L 29/78; H01L 28/24; H01L 29/665; H01L 29/0653
USPC ........................................................... 438/382
See application file for complete search history.

(56) References Cited

U.S. PATENT DOCUMENTS

| 8,334,572 | B2 | 12/2012 | Chung et al. |
| 9,012,293 | B2* | 4/2015 | Xiao ................. H01L 28/20 257/536 |
| 9,111,768 | B2* | 8/2015 | Lu ...................... H01L 28/24 |
| 9,530,770 | B2 | 12/2016 | Romanescu et al. |
| 9,698,212 | B2* | 7/2017 | Basker ................ H01L 27/13 |
| 9,876,010 | B1 | 1/2018 | Zang et al. |
| 2013/0093024 | A1 | 4/2013 | Eshun |

* cited by examiner

*Primary Examiner* — Vu A Vu
(74) *Attorney, Agent, or Firm* — Francois Pagette; Hoffman Warnick LLC (57) ABSTRACT

A structure includes a first dielectric over a trench silicide (TS) contact and over a gate structure, and at least one cavity in the first dielectric. A metal resistor layer is on a bottom and sidewalls of the at least one cavity and extends over the first dielectric. A first contact is on the metal resistor layer over the first dielectric; and a second contact is on the metal resistor layer over the first dielectric. The metal resistor layer is over the TS contact and over the gate structure. Where a plurality of cavities are provided in the dielectric, a resistor structure formed by the metal resistor layer may have an undulating cross-section over the plurality of cavities and the dielectric.

20 Claims, 9 Drawing Sheets

//USPTO Patent US 10,833,067 B1//

METAL RESISTOR STRUCTURE IN AT LEAST ONE CAVITY IN DIELECTRIC OVER TS CONTACT AND GATE STRUCTURE

BACKGROUND

The present disclosure relates to integrated circuit (IC) fabrication, and more specifically, to a metal resistor structure that extends through at least one cavity in a dielectric over a trench silicide (TS) contact and a gate structure.

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gate structures may be composed of various metals and often include a work function metal which is chosen to create desired characteristics of the FET. Transistors may be formed over a substrate and may be electrically isolated with an insulating dielectric layer, e.g., inter-level dielectric (ILD) layer. Trench silicide (TS) contacts may be formed to each of the source, drain, and gate regions through the dielectric layer in order to provide electrical connection between the transistors and other circuit elements that may be formed subsequent to the transistor in other metal levels. Resistors for an IC are oftentimes formed in ILD layers above the FETs. These layers are referred to as middle-of-line (MOL) layers and back-end-of-line (BEOL) layers. MOL layers are just above the front-end-of-line (FEOL) layers that include the FETs, and BEOL layers are above the MOL layers. Both MOL and BEOL layers provide scaling interconnects for the IC. Formation of the resistors in the MOL or BEOL layers requires a number of steps, e.g., masking, etching and depositing of materials, that adds to the complexity of the overall process and can reduce the yield window for these layers. The resistors also add thickness to the layers. The metal resistor structures extend in a plane within a dielectric layer. As continuing miniaturization of ICs proceeds, the ability to scale and further miniaturize the metal resistors is limited due to their planar arrangement.

SUMMARY

A first aspect of the disclosure is directed to a resistor structure, comprising: a first dielectric over a trench silicide (TS) contact and over a gate structure; at least one cavity in the first dielectric; a metal resistor layer on a bottom and sidewalls of the at least one cavity and extending over the first dielectric; a first contact on the metal resistor layer over the first dielectric; and a second contact on the metal resistor layer over the first dielectric, wherein the metal resistor layer is over the TS contact and over the gate structure.

A second aspect of the disclosure includes a method comprising: providing a structure including an etch stop layer (ESL) over a trench silicide (TS) contact and a gate structure; forming a first dielectric over the structure; forming at least one cavity in the first dielectric; forming a metal resistor layer on a bottom and sidewalls of the at least one cavity and extending over the first dielectric; forming a second dielectric to fill a remaining portion of the least one cavity not filled by the metal resistor layer; and forming a first contact and a second contact on the metal resistor layer over the first dielectric to form a resistor structure.

A third aspect relates to a resistor structure, comprising: a metal resistor layer extending on a bottom and sidewalls of a plurality of cavities in a dielectric and extending over the dielectric, wherein the dielectric and the metal resistor layer are positioned over a trench silicide (TS) contact and over a gate structure; a first contact on the metal resistor layer over the dielectric; and a second contact on the metal resistor layer over the dielectric, wherein the metal resistor layer has an undulating cross-section over the dielectric and the plurality of cavities.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure relate to an integrated circuit (IC) structure and a resistor structure therefor. The resistor structure includes a thin film metal resistor layer extending over at least one cavity in a dielectric. The dielectric is over a TS contact and a gate structure, e.g., in an MOL layer. More than one cavity can be used and the length of the resistor structure can be customized to create any necessary resistive value. The resistor structure may have an undulating cross-section, i.e., extending both horizontally and vertically in a three-dimensional (3D) fashion, which reduces the amount of horizontal area required for the resistor structure, but also allows for the necessary resistive value to be created. The metal resistor layer can be patterned to a desired area and/or length, and contacts on the metal resistor layer can be spaced to determine the resistive value of the resistor structure.

Figure 1:
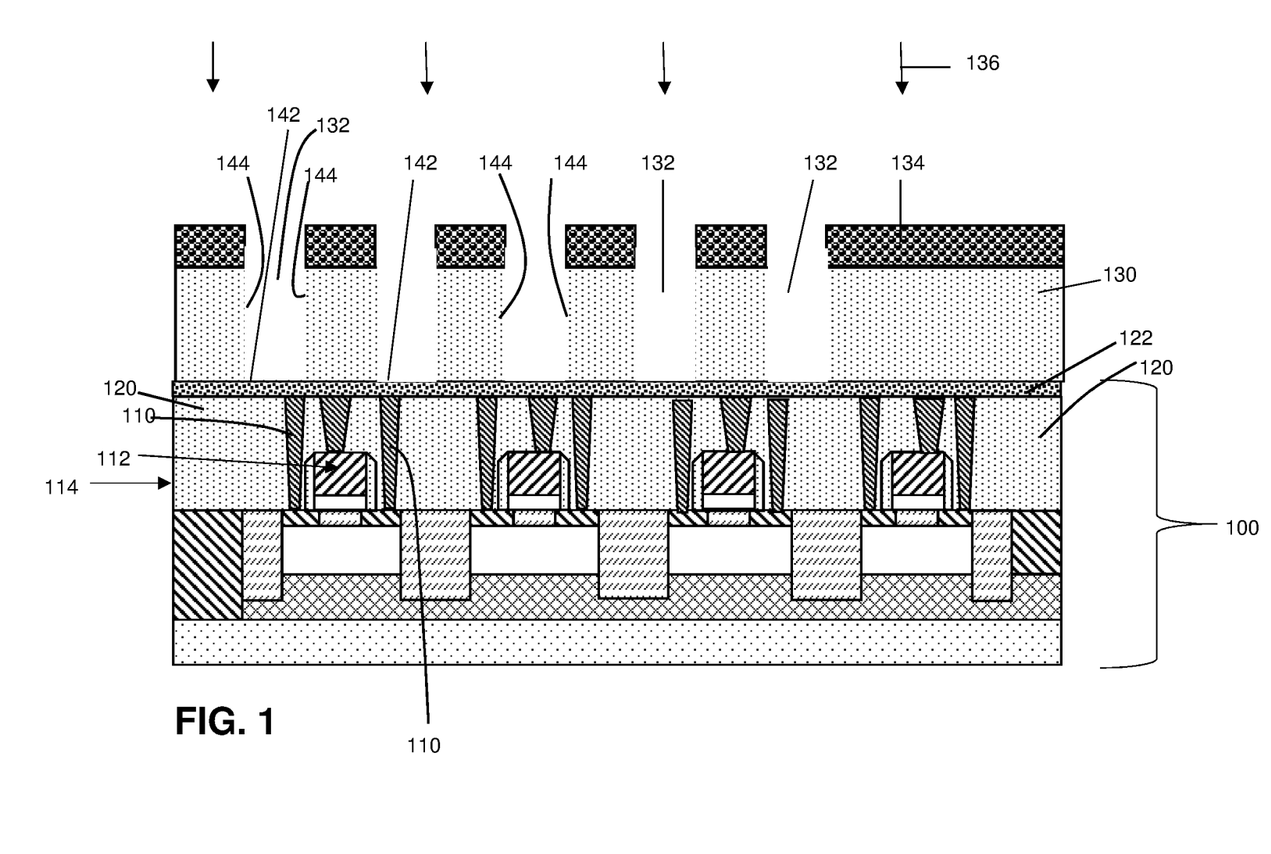
FIG. 1 shows a cross-sectional view of a preliminary structure including a dielectric over a TS contact and a gate structure, according to embodiments of the disclosure.

Referring to the drawings, a method of forming the IC structure and the resistor structure will be described. FIG. 1 shows a cross-sectional view of providing a preliminary structure 100 including an etch stop layer (ESL) 122 over a trench silicide (TS) contact 110 and a gate structure 112. Preliminary structure 100 may include TS contact 110 and gate structure 112 in a device layer 114. Preliminary structure 100 may be formed using any now known or later developed IC fabrication techniques. While a particular type of field effect transistor (FET) and related gate structure 112 has been illustrated, e.g., a FinFET, it is understood that the teachings of the disclosure are agnostic to FET and/or gate structure form. TS contact 110 may include any now known or later developed contact structure such as a contact conductor like tungsten or copper, surrounded by a refractory metal liner (not shown for clarity) such as ruthenium, tantalum (Ta), titanium (Ti), tungsten (W), iridium (Ir), rhodium (Rh) and platinum (Pt), etc., or mixtures of thereof. TS contact 110 is referred to as a "trench silicide" contact because it is within device layer 114. Gate structure 112 may include any now known or later developed gate materials such as those used in a high dielectric constant metal gate (HKMG). For example, an HKMG may include a high dielectric constant (high-K) layer, a work function metal layer and a gate conductor. The high-K layer may include any now known or later developed high-K material (K>3.9) typically used for metal gates such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). The work function metal layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The gate conductor may include any now known or later developed gate conductor such as copper (Cu). A gate cap of, for example, a nitride may also be formed over each gate conductor. Conventional spacers may isolate gate structure from other structures.

TS contact 110 and gate structure 112 may be surrounded by any now known or later developed interlayer dielectric (ILD) 120 including but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. In one embodiment, ILD 120 may include a tetraethyl orthosilicate, $Si(OC_2H_5)_4$ (TEOS) based silicon oxide ($SiO_2$).

Preliminary structure 100 may also include ESL 122 over ILD 120. ESL 122 may include any now known or later developed ESL material. In one example, ESL 122 may include silicon carbon nitride (SiCN). ESL 122 may be formed using any appropriate deposition technique. "Depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. ESL 122 may be deposited, for example, using ALD.

FIG. 1 also shows forming a dielectric 130 over preliminary structure 100. Dielectric 130 may include any ILD previously described herein, but in one example, may include silicon oxide ($SiO_2$). Dielectric 130 may be formed using any appropriate deposition technique for the material used, e.g., ALD for $SiO_2$.

Figure 6:
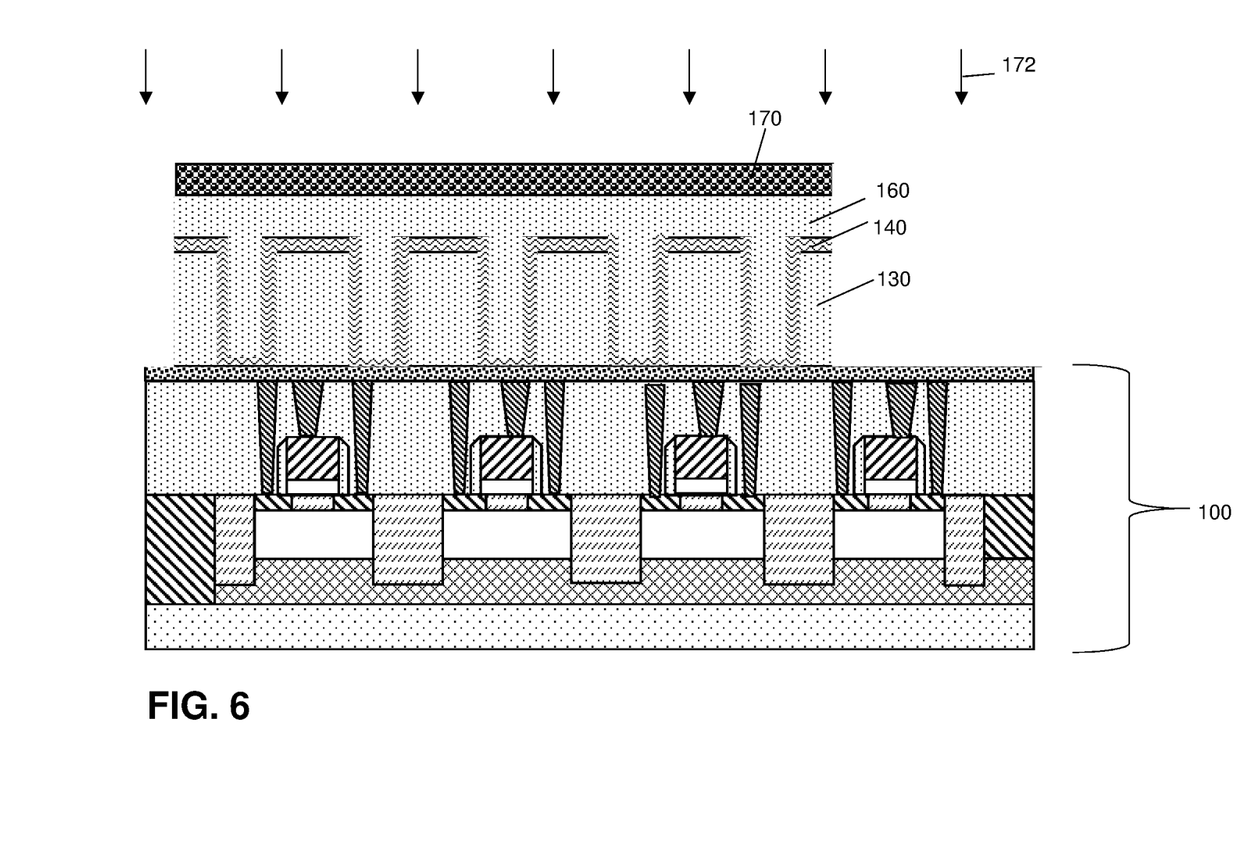
FIG. 6 shows a cross-sectional view of the metal resistor layer over the at least one cavity in the dielectric after the optional patterning, according to embodiments of the disclosure.
Figure 7:
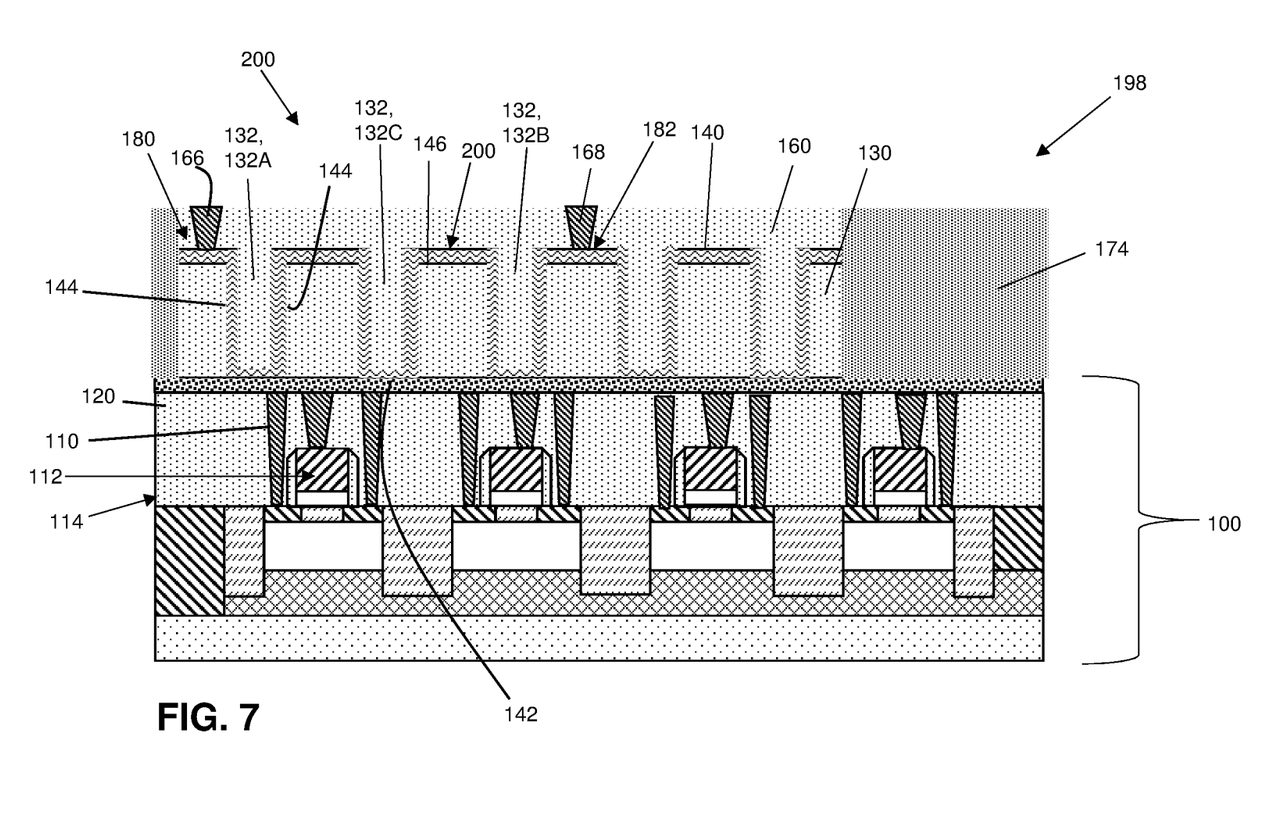
FIG. 7 shows a cross-sectional view of a resistor structure including the metal resistor layer with an undulating cross-section, according to embodiments of the disclosure.
Figure 8:
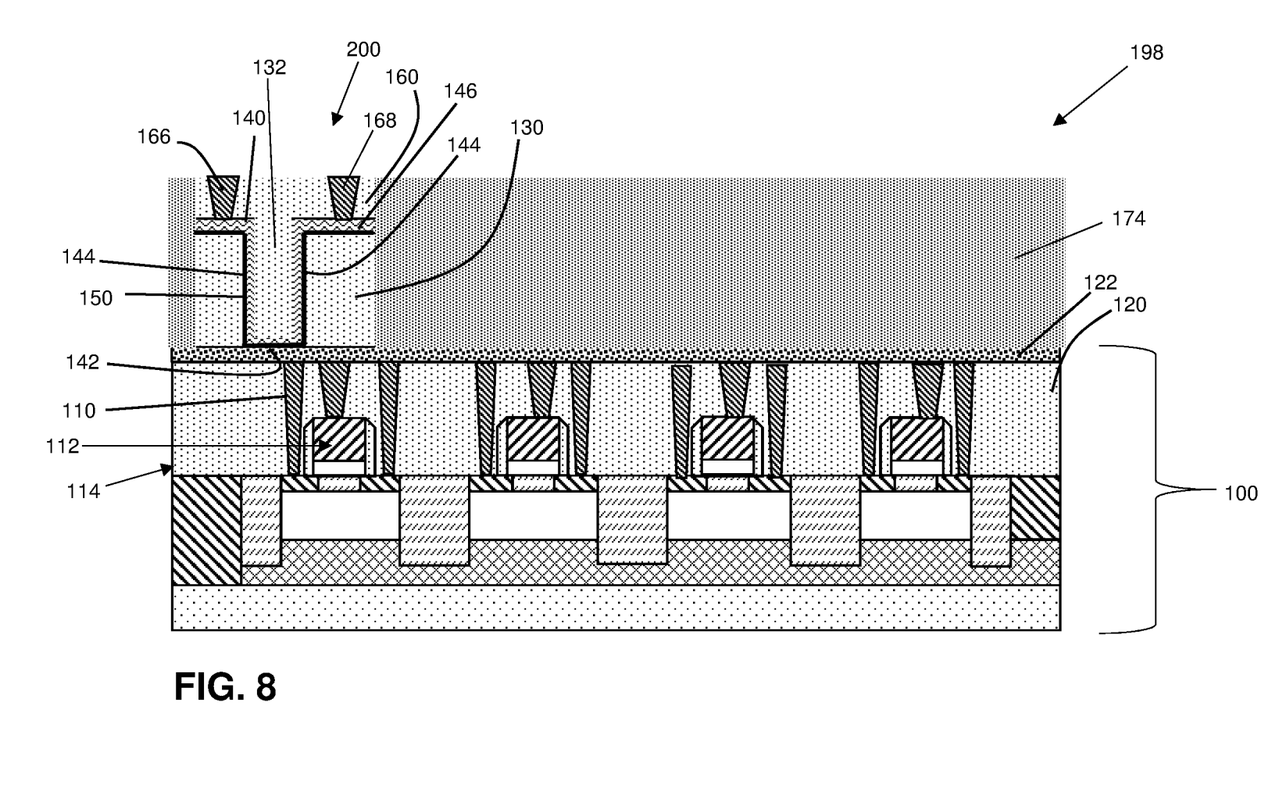
FIG. 8 shows a cross-sectional view of a resistor structure including the metal resistor layer over a single cavity in the dielectric, according to another embodiment of the disclosure.

FIG. 1 also shows forming at least one cavity 132 in dielectric 130. FIGS. 1-7 show embodiments employing a plurality of cavities 132 in dielectric 130, and FIG. 8 shows a single cavity 132. Although one cavity 132 can be employed (FIG. 8), for clarity hereafter, unless otherwise necessary, reference will be made to cavities 132. Cavities 132 may be formed by any now known or later developed IC fabrication techniques such as but not limited to photolithography. In photolithography, a radiation sensitive "resist" layer is formed over one or more layers which are to have a pattern transferred thereto. The resist, which is sometimes referred to as a photoresist, is first patterned by exposing it to radiation, where the radiation (selectively) passes through an intervening mask or template (not shown) containing the pattern. As a result, the exposed or unexposed areas of the resist become more or less soluble, depending on the type of photoresist used. A developer is then used to remove the more soluble areas of the resist leaving a patterned resist. The patterned resist can then serve as a mask 134 for the underlying layers which can then be selectively etched 136. Mask 134 may include any now known or later developed mask material such as but not limited to a developable organic planarization layer (OPL) on the layer to be etched, a developable anti-reflective coating (ARC) layer on the developable OPL, and a photoresist mask layer on the developable ARC layer.

Etching generally refers to the removal of material from a substrate (or structures formed on the substrate), and is often performed with mask, e.g., mask 134, in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Dielectric 130 may be etched 136 to form cavities 132 using, for example, a RIE. Cavities 132 can have any desired width or length capable of creating area and/or length an eventual resistor structure with the desired resistive value. In a non-limiting example, cavities 132 can be any width from 50-300 nanometers wide, and have a similar length. Cavity 132 formation may include etching to ESL 122 to expose a bottom 142 of each cavity 132.

Figure 2:
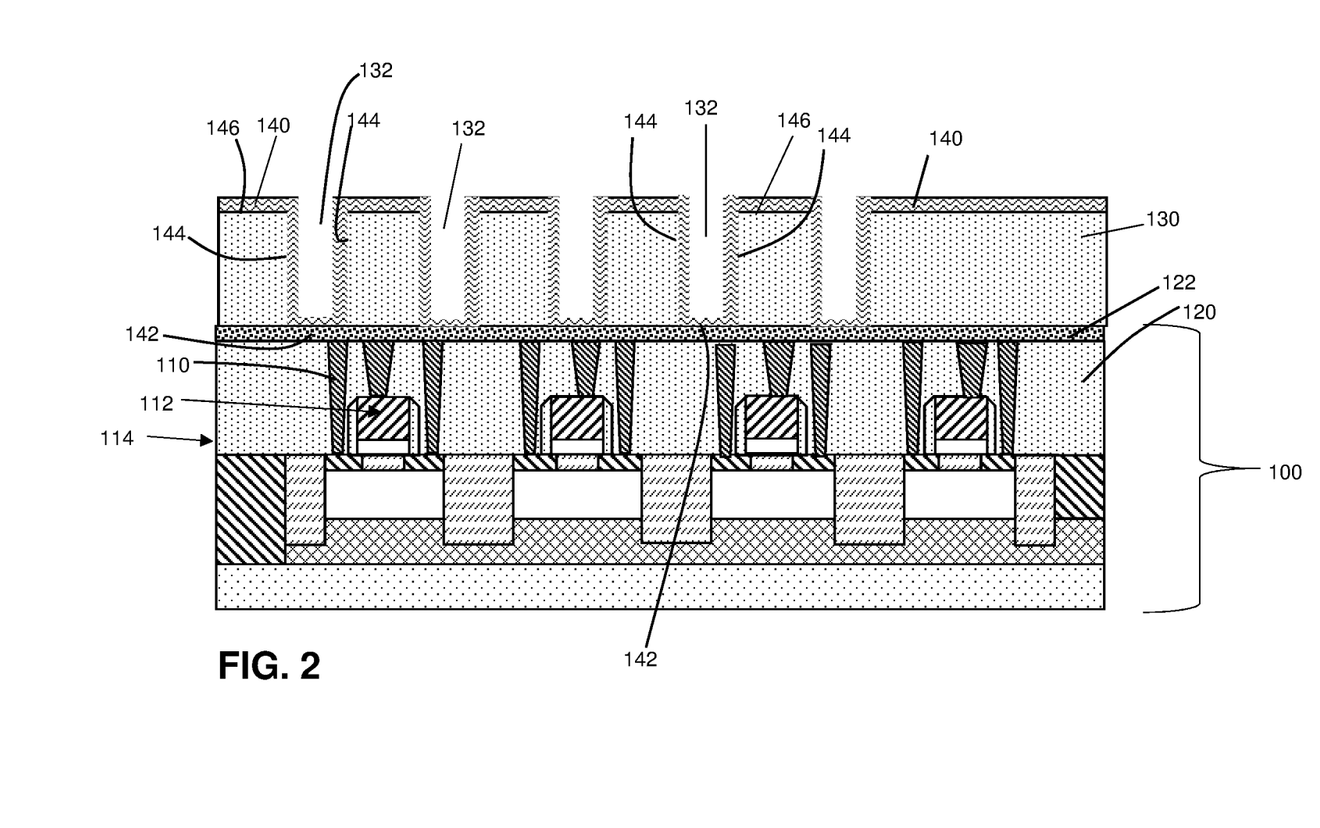
FIG. 2 shows a cross-sectional view of a metal resistor layer in at least one cavity in the dielectric, according to embodiments of the disclosure.

FIG. 2 shows a cross-sectional view of forming a metal resistor layer 140 on bottom 142 and sidewalls 144 of at least one cavity 132 and extending over dielectric 130. Mask 134 (FIG. 1) may be first removed using any now known or later developed technique, e.g., an ashing process. Metal resistor layer 140 is conformal and covers bottom 142 and sidewalls 144 and an upper surface 146 of dielectric 130. Metal resistor layer 140 is a thin film, and may have a thickness of, for example, 2-20 nanometers. Metal resistor layer 140 may include any now known or later developed metal resistor material such as but not limited: titanium nitride (TiN) or tungsten silicide (WSix). Metal resistor layer 140 may be formed using any now known or later developed technique, e.g., ALD.

Figure 3:
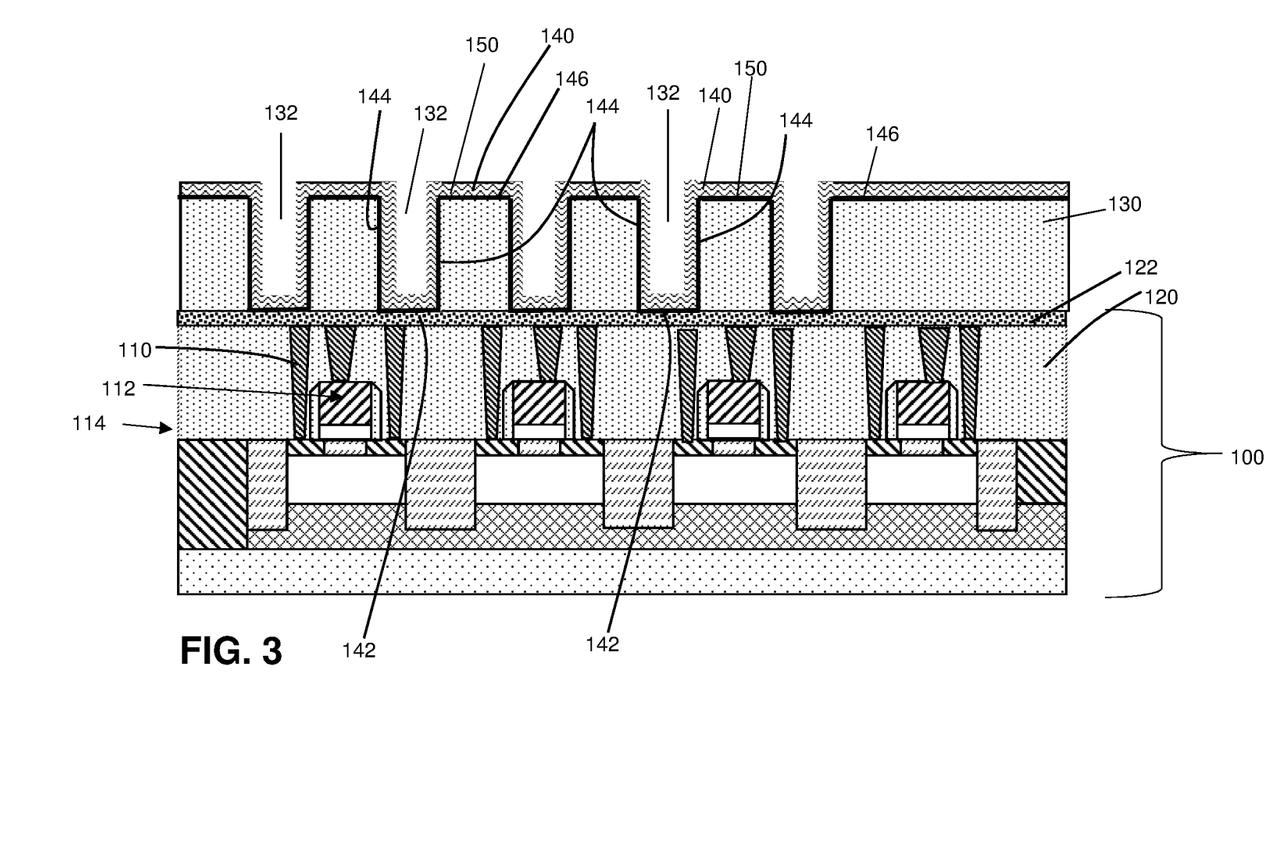
FIG. 3 shows a cross-sectional view of the metal resistor layer over an optional high dielectric constant layer in at least one cavity in the dielectric, according to embodiments of the disclosure.

FIG. 3 show a cross-sectional view of optionally forming a high dielectric constant (high-K) layer 150 on bottom 142 and sidewalls 144 of at least one cavity 132 and extending over dielectric 130, prior to forming metal resistor layer 140. High-K layer 150 may be desired in some cases to prevent electrical shorts and/or current leakage. High-K layer 150 may be formed using any appropriate deposition technique, e.g., ALD. High-K layer 150 may have a thickness of, for example, 1-3 nanometers, and as shown, is conformal. High-K layer 150 may include any now known or later developed high-K material typically used for metal resistors such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Metal resistor layer 140 may be formed over high-K layer 150, as previously described. Subsequent figures omit high-K layer 150 for clarity.

Figure 4:
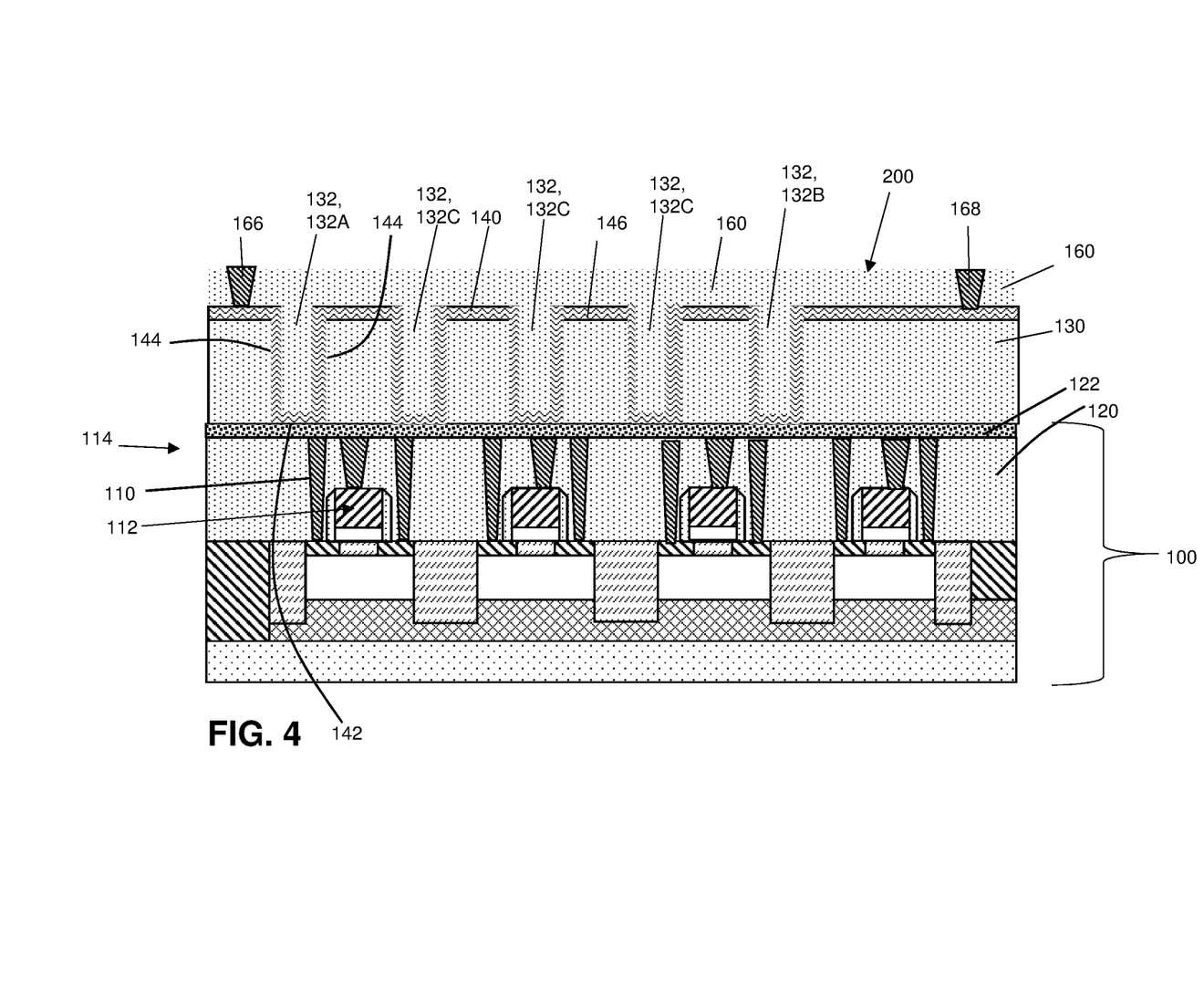
FIG. 4 shows a cross-sectional view of a resistor structure including the metal resistor layer with an undulating cross-section, according to embodiments of the disclosure.
Figure 5A:
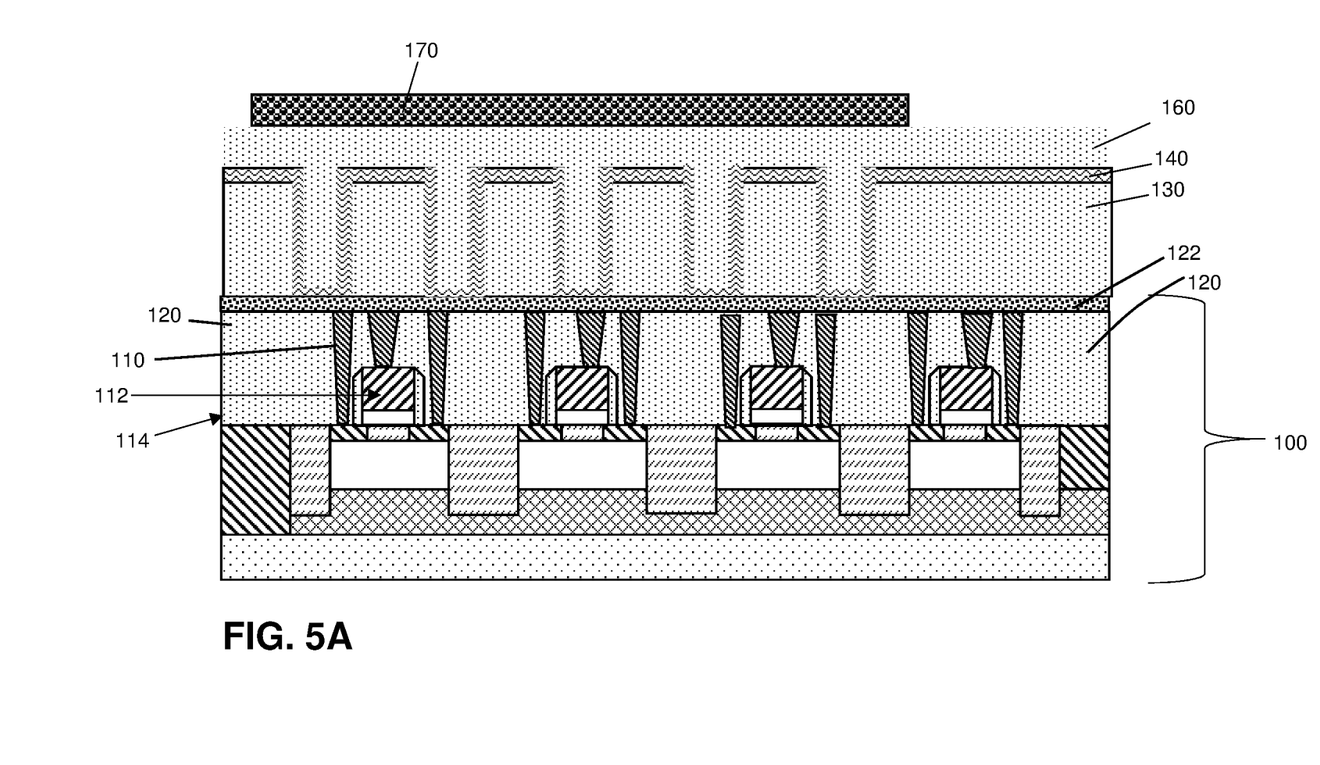
FIG. 5A shows a cross-sectional view of optionally patterning the metal resistor layer over the at least one cavity in the dielectric, according to embodiments of the disclosure.
Figure 5B:
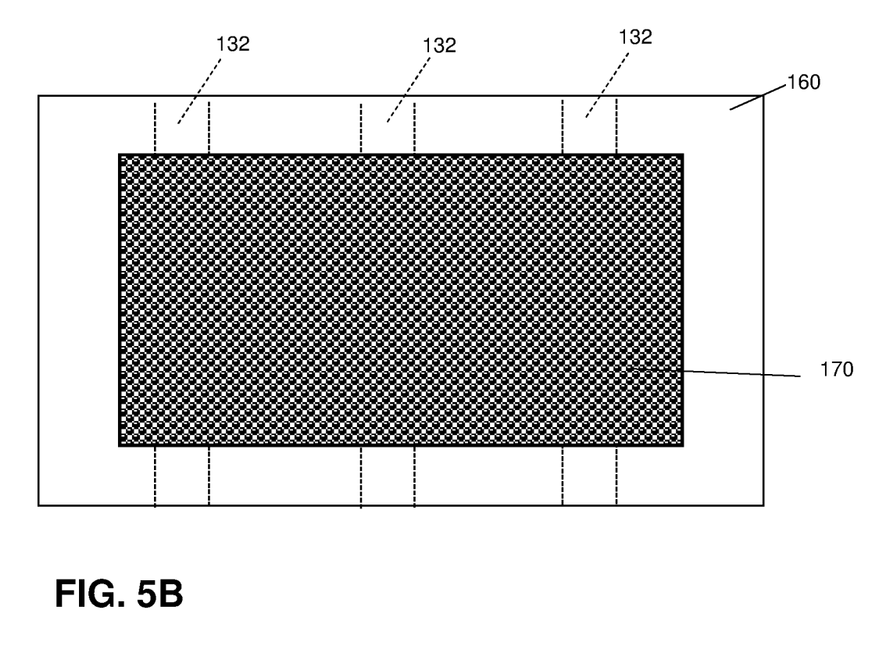
FIG. 5B shows a plan view of optionally patterning the metal resistor layer over the at least one cavity in the dielectric, according to embodiments of the disclosure.

FIG. 4 shows a cross-sectional view of forming a dielectric 160 to fill a remaining portion of cavities 132 not filled by metal resistor layer 140 (and high-K layer 50, where provided). Dielectric 160 may include any ILD previously described herein, but in one example, may include silicon oxide ($SiO_2$). Dielectric 160 may be formed using any appropriate deposition technique for the material used, e.g., ALD for $SiO_2$.

Conventionally, apart from a thickness of material of the metal resistor, a length (side-to-side across page) and/or width (into and out of page) of a planar metal resistor determines the resistive value of the resistor structure formed thereby. As illustrated, a desired length dimension (side-to-side across page) required to create the desired resistive value is now determined by the length of metal resistor layer 140 extending through at least one cavity 132, rather than just by a planar dimension. Where a plurality of cavities 132 are used, metal resistor layer 140 has an undulating cross-section over dielectric 130 and into cavities 132. A width (into and out of page) of metal resistor layer 140 may also determine resistive value. In some instances, metal resistor layer 140 may be formed with the desired area width and length (latter through at least one cavity 132) to create a resistor structure 200 with the desired resistive value. In this case, as also shown in FIG. 4, the method may include forming a first contact 166 and a second contact 168 on metal resistor layer 140 over dielectric 130 to form a resistor structure 200. In most cases, however, metal resistor layer 140 (and high-K layer 150, where provided) it is desirable to pattern metal resistor layer 140 to achieve the desired resistor area. In this case, as shown in the cross-sectional view of FIG. 5A and the plan view of FIG. 5B, a mask 170 may be formed over dielectric 160 that exposes unwanted portions of metal resistor layer 140 (and high-K layer 150, where provided). As shown in FIG. 6, an etch 172, such as a RIE, removes unwanted portions of metal resistor layer 140 (and high-K layer 150, where provided). In this fashion, the width and/or length of metal resistor layer 140 can be chosen to arrive at the desired resistive value, using cavities 132 to create a longer length without using the same amount of horizontal real estate as a planar resistor structure. FIG. 7 shows creating dielectric 174 such as silicon oxide ($SiO_2$), in the areas removed by etch 172 (FIG. 6). Dielectric 174 may be formed using any appropriate deposition technique for the material used, e.g., ALD for $SiO_2$, and may be planarized to the height of dielectric 160. At this point, as shown in FIG. 7, after patterning, the method may include forming first contact 166 and second contact 168 on metal resistor layer 140 over dielectric 130 to form a resistor structure 200. FIG. 8 shows an embodiment after similar processing in which only a single cavity 132 is used. That is, metal resistor layer 140 extends on bottom 142 and sidewalls 144 of single cavity 132 and over dielectric 130 to the side of single cavity 132. FIG. 8 also shows use of high-K layer 150.

As shown in FIGS. 4 and 7, contacts 166, 168 may be formed using any now known or later developed technique, e.g., damascene (shown) or dual damascene (not shown). Here, the interconnect (contact) pattern is first lithographically defined in dielectric 130 (e.g., using a mask), then metal is deposited to fill resulting trenches, and then excess metal is removed by means of chemical-mechanical polishing (planarization). Each contact 166, 168 may include any now known or later developed contact structure such as a contact conductor like tungsten or copper, surrounded by a refractory metal liner such as ruthenium, tantalum (Ta), titanium (Ti), tungsten (W), iridium (Ir), rhodium (Rh) and platinum (Pt), etc., or mixtures of thereof. Each contact 166, 168 may be formed to metal resistor layer 140 at an uppermost location thereof as it passes over dielectric 130, i.e., over upper surface 146 of dielectric 130. Subsequently formed, metal wire(s) and via layer(s) over contacts 166, 168 are not shown.

Contact 166, 168 location along a length (side-to-side) of resistor structure 200 also determines the resistive value of resistor structure 200. That is, all things otherwise equal, a length of metal resistor layer 140 between first contact 166 and second contact 168 determines a resistive value of resistor structure 200. In one embodiment, as shown in for example FIGS. 4 and 7, first and second contact 166, 168 formation may include forming first contact 166 over metal resistor layer 140 at a first uppermost location 180 over dielectric 130 adjacent a first cavity 132A of the plurality of cavities, and forming second contact 168 over metal resistor layer 140 at a second uppermost location 182 over dielectric 130 adjacent a second cavity 132B of the plurality of cavities. As shown in FIGS. 4 and 7, at least one third cavity 132C may be located between first cavity 132A and second cavity 132B. In non-limited examples, FIG. 7 shows one third cavity 132C, and FIG. 4 shows three third cavities 132C. Any number of third cavities 132C may be employed. Metal resistor layer 140 (and high-K layer 150, where provided) is on bottom 142 and sidewalls 144 of each cavity 132 and over upper surface 146 of dielectric 130 between cavities, creating an undulating cross-section thereof.

An IC structure 198 including resistor structure 200 is shown in FIGS. 4, 7 and 8. Resistor structure 200 may include dielectric 130 over TS contact 110 and over gate structure 112. While the drawings, show an aligned arrangement, it is understood that TS contact and gate structure 112 may be linearly offset. Resistor structure 200 also includes at least one cavity 132 in dielectric 130. FIGS. 1-7 show a plurality of cavities 132, and FIG. 8 shows a single cavity 132. In non-limiting examples, FIG. 4 shows five cavities 132, FIG. 7 shows three cavities 132, and FIG. 8 shows a single cavity 132. ESL 122 may be between dielectric 130 and TS contact 110 and gate structure 112. Bottom 142 of cavities 132 may be at an upper surface of ESL 122. Metal resistor layer 140 is on bottom 142 and sidewalls 144 of each cavity 132 that is/are part of resistor structure 200. Metal resistor layer 140 also extends over dielectric 130, i.e., over upper surface 146 thereof adjacent cavities 132. Metal resistor layer 140 is also over TS contact 110 and over gate structure 112, e.g., in an MOL layer, not in device layer 114. Dielectric 160 fills a remaining portion of each cavity 132 not filled by metal resistor layer 140 (and high-K layer 150, where provided). First contact 166 is on metal resistor layer 140 over dielectric 130, and second contact 168 is on metal resistor layer 140 over dielectric 130. First contact 166 may be over metal resistor layer 140 at first uppermost location 180 (FIG. 7) over dielectric 130 adjacent a first cavity 132A. Second contact 168 may be over metal resistor layer 140 at distanced, second uppermost location 182 (FIG. 7) over dielectric 130 adjacent a second cavity 132B. As noted, any number of third cavities 132C may be between the first and second cavity. A length (side-to-side across page) of metal resistor layer 140 between first contact 166 and second contact 168 can determine a resistive value of resistor structure 200. Metal resistor layer 140 has an undulating cross-section as it extends over dielectric 130 and into plurality of cavities 132. As shown in FIGS. 3 and 8, high-K layer 150 may optionally extend between metal resistor layer 140 and dielectric 130. In another embodiment, shown in FIG. 8, a single cavity 132 may be employed for a shorter, lower resistive value, resistor structure 200.

Embodiments of the disclosure provide an IC structure 198 with a resistor structure 200 having a resistive value larger than what is possible with a planar resistor of the same horizontal dimensions. Use of a plurality of cavities creates a resistor structure 200 with an undulating cross-section including both horizontal and vertical extents, rather than a planar or horizontally linear cross-section.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
    a first dielectric over a trench silicide (TS) contact and over a gate structure;
    at least one cavity in the first dielectric;
    a metal resistor layer on a bottom and sidewalls of the at least one cavity and extending over the first dielectric;
    a high dielectric constant (high-K) layer extending between the metal resistor layer and the first dielectric;
    a first contact on the metal resistor layer over the first dielectric; and
    a second contact on the metal resistor layer over the first dielectric,
    wherein the metal resistor layer is over the TS contact and over the gate structure.

2. The IC structure of claim 1, wherein the metal resistor layer includes tungsten silicide (WSi).

3. The IC structure of claim 1, further comprising an etch stop layer (ESL) between the first dielectric and the TS contact and the gate structure, wherein the bottom of the at least one cavity exposes the ESL.

4. The IC structure of claim 1, wherein the at least one cavity includes a plurality of cavities.

5. The IC structure of claim 4, wherein the first contact is over the metal resistor layer at a first uppermost location over the first dielectric adjacent a first cavity of the plurality of cavities, and the second contact is over the metal resistor layer at a second uppermost location over the first dielectric adjacent a second cavity of the plurality of cavities.

6. The IC structure of claim 5, further comprising at least one third cavity in the first dielectric between the first cavity and the second cavity.

7. The IC structure of claim 4, wherein the metal resistor layer has an undulating cross-section over the first dielectric and into the plurality of cavities.

8. The IC structure of claim 1, further comprising a second dielectric filling a remaining portion of each cavity not filled by the metal resistor layer.

9. The IC structure of claim 1, wherein a length of the metal resistor layer between the first contact and the second contact determines a resistive value of a resistor formed thereby.

10. The IC structure of claim 1, wherein the metal resistor layer includes titanium nitride (TiN).

11. A method comprising:
    providing a structure including an etch stop layer (ESL) over a trench silicide (TS) contact and a gate structure;
    forming a first dielectric over the structure;
    forming at least one cavity in the first dielectric to the ESL over the TS contact and the gate structure to expose a bottom of the at least one cavity;
    forming a metal resistor layer on sidewalls and the bottom of the at least one cavity and extending over the first dielectric;
    forming a second dielectric to fill a remaining portion of the least one cavity not filled by the metal resistor layer; and
    forming a first contact and a second contact on the metal resistor layer over the first dielectric to form a resistor structure.

12. The method of claim 11, further comprising removing a portion of the metal resistor layer to define an area of the resistor structure.

13. The method of claim 11, wherein the metal resistor layer includes tungsten silicide (WSi).

14. The method of claim 11, further comprising forming a high dielectric constant (high-K) layer on the bottom and sidewalls of the at least one cavity and extending over the first dielectric.

15. The method of claim 11, wherein forming the at least one cavity includes forming a plurality of cavities in the first dielectric, and wherein forming the first and second contacts includes forming the first contact over the metal resistor layer at a first uppermost location over the first dielectric adjacent a first cavity of the plurality of cavities, and forming the second contact over the metal resistor layer at a second uppermost location over the first dielectric adjacent a second cavity of the plurality of cavities.

16. The method of claim 15, further comprising at least one third cavity between the first cavity and the second cavity.

17. The method of claim 16, wherein the metal resistor layer has an undulating cross-section over the first dielectric and the plurality of cavities.

18. The method of claim 11, wherein a length of the metal resistor layer between the first contact and the second contact determines a resistive value of the resistor structure.

19. A resistor structure, comprising:
    a metal resistor layer extending on a bottom and sidewalls of a plurality of cavities in a dielectric and extending over the dielectric, wherein the dielectric and the metal resistor layer are positioned over a trench silicide (TS) contact and over a gate structure;
    a high dielectric constant (high-K) layer extending between the metal resistor layer and the dielectric;
    a first contact on the metal resistor layer over the dielectric; and
    a second contact on the metal resistor layer over the dielectric,
    wherein the metal resistor layer has an undulating cross-section over the dielectric and the plurality of cavities.

20. The method of claim 11, wherein the metal resistor layer includes titanium nitride (TiN).

* * * * *